Nov. 5, 1968 W. E. WHIPPLE ET AL 3,409,805

PRINTED-CIRCUIT BOARD COUPLING CIRCUIT WITH D-C ISOLATION

Filed Aug. 12, 1965 3 Sheets-Sheet 1

INVENTORS
Willard E. Whipple
Edward Schoppe, Jr.
William E. Earle
BY
Curtis, Morris & Safford
ATTORNEYS

PRINTED-CIRCUIT BOARD COUPLING CIRCUIT WITH D-C ISOLATION

Filed Aug. 12, 1965 3 Sheets-Sheet 2

3,409,805
PRINTED-CIRCUIT BOARD COUPLING CIRCUIT WITH D-C ISOLATION

Willard E. Whipple, Wrentham, Edward Schoppe, Jr., Walpole, and William E. Earle, N. Easton, Mass., assignors to The Foxboro Company, Foxboro, Mass.

Filed Aug. 12, 1965, Ser. No. 479,238
11 Claims. (Cl. 317—101)

ABSTRACT OF THE DISCLOSURE

A printed circuit construction providing conductively isolated coupling between a signal circuit and a receiving circuit, the construction including a pair of parallel circuit boards having spiral windings in axial alignment to permit inductive coupling therebetween, one circuit board carrying circuitry for generating an A-C signal in the respective winding, the other circuit board including a rectifier-circuit producing a D-C signal in response to any A-C voltage induced in its spiral winding, there being an electrostatic shield between the two windings in the form of a plurality of elongate strips of conductive material positioned side-by-side but not touching one another except at one end thereof, thereby to permit inductive coupling between the spiral windings.

The present invention relates to an electronic circuit construction which is advantageously employed in an electronic switch.

It is desirable in many D-C signal systems to provide conductive isolation between various components of the system. Such isolation affords flexibility in installation in that the inputs or outputs of the components may be grounded or connected to predetermined D-C levels without adversely affecting the signals in the system. Also, isolation is desirable in some cases to minimize leakage currents in circuits which are sensitive to low-level current flow. For example, in certain computer control systems it is required to provide an electronic switch operable by a D-C input signal, yet having an output conductively isolated from the input by means presenting an extremely high D-C resistance to the flow of leakage currents.

Accordingly, it is an object of this invention to provide an improved electronic switch construction. It is another object of this invention to provide a new and improved electronic switch construction which may be employed for conductively isolating various stages of an electrical system. Still another object of the present invention is to provide an electronic switch construction which is relatively small and economical to manufacture. Other objects, aspects and advantages of the invention will in part be pointed out in, and in part apparent from, the following description of a preferred embodiment of the invention.

This embodiment includes a first insulating board having a first printed circuit thereon and a second insulating board having a second printed circuit thereon. Also included is a printed circuit transformer having the primary winding thereof on the first insulating board and electrically connected into the first printed circuit, and the secondary winding thereof on the second insulating board opposite the primary winding and electrically connected into the second printed circuit. This circuit construction further includes an electrical shielding member interposed between the first and second insulating boards and having a solid planar portion disposed between the first and second printed circuits for electrically shielding the printed circuits from each other to prevent capacitive coupling between the printed circuits, and an interspaced portion disposed between the primary and secondary windings of the printed circuit transformer for permitting inductive coupling between the windings.

This embodiment further includes an initially quiescent oscillator including a primary winding of a transformer and means for translating an input signal from a signal source to the oscillator to energize the oscillator and develop a series of oscillations across the primary winding for the duration of the input signal. The oscillations coupled to the secondary of the transformer are rectified to produce a D-C control signal conductively isolated from the input signal, and operable to control a pair of transistors to effect the desired switching function.

For a better understanding of the present invention, together with other and further objects thereof, reference is made to the following description, taken in connection with the accompanying drawings, and its scope will be pointed out in the appended claims.

Referring to the drawings.

Figure 1:
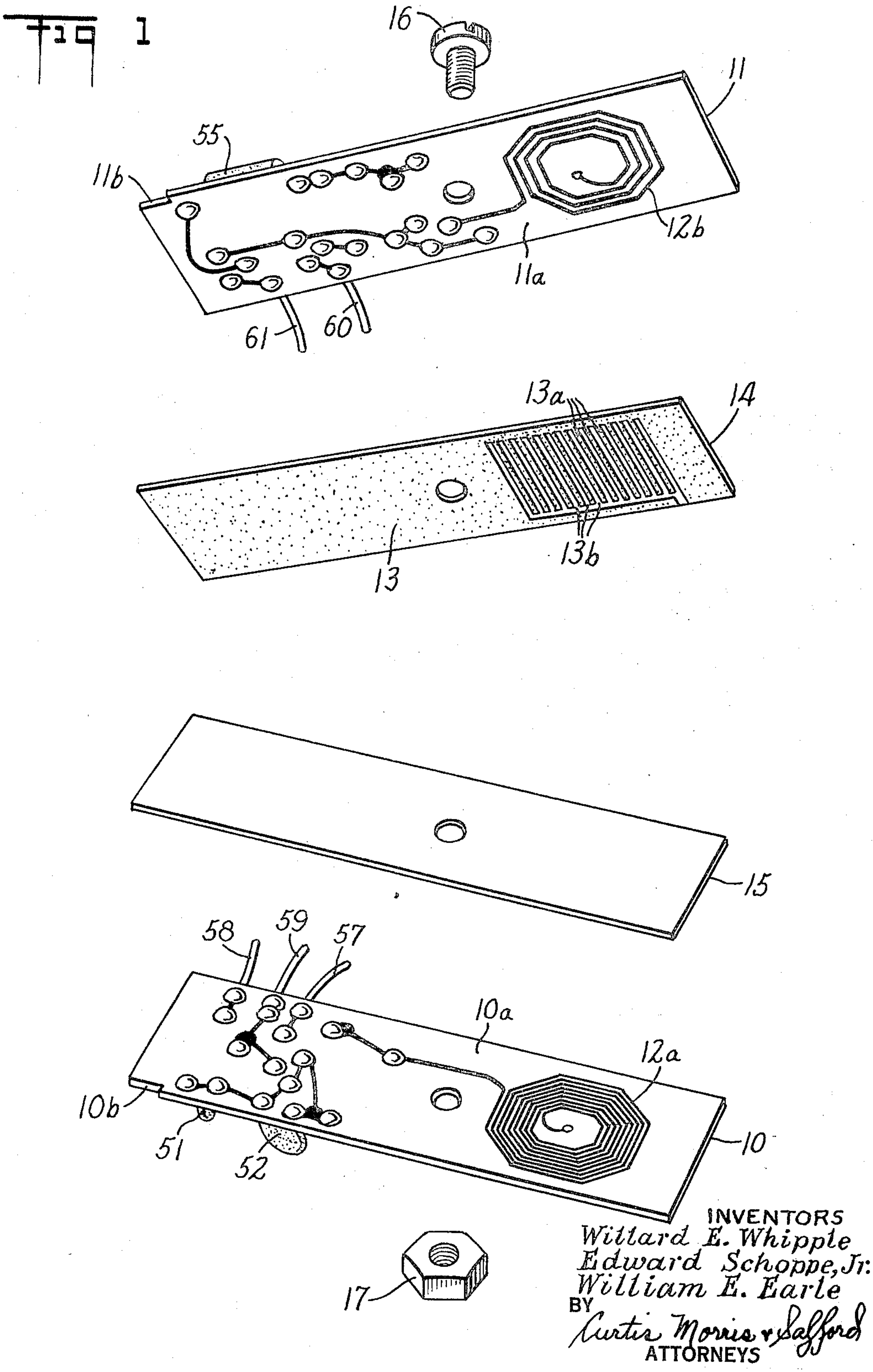
FIGURE 1 is an exploded perspective view of an electronic circuit construction according to the present invention.
Figure 2:
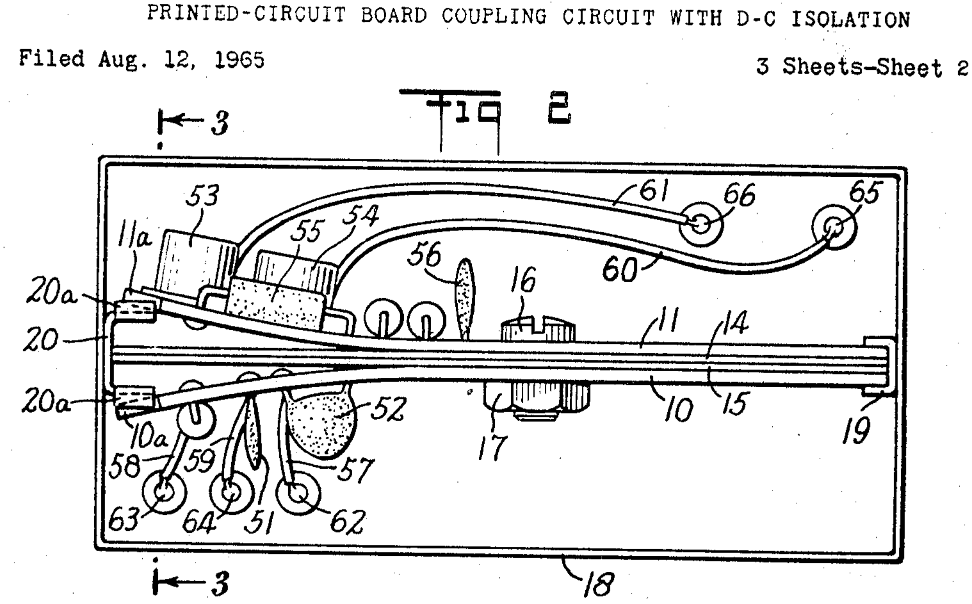
FIGURE 2 shows the electronic circuit construction of FIGURE 1 held together as a unit in a case.
Figure 4:
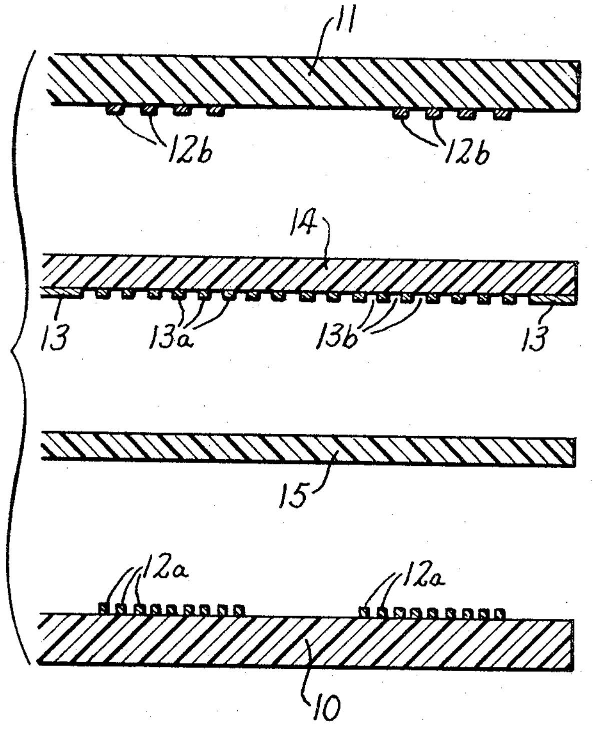
FIGURE 4 is an exploded sectional view showing the details of the transformer section of the electronic circuit construction of FIGURE 1.

Referring to FIGURES 1, 2 and 4, an electronic circuit construction according to the present invention includes a first insulating board 10 having a first printed circuit thereon. Insulating board 10 may be of the usual epoxy material commonly used in printed circuit construction. The printed circuit on insulating board 10 includes printed wiring on surface 10*a* of the board and electrical components, such as capacitors 51 and 52, mounted on the opposite surface of the board. The development of the printed wiring, the mounting of the electrical components and the connection of the components to the printed wiring may be achieved by employing the usual printed circuit techniques.

Also included in the electronic circuit construction is a second insulating board 11 having a second printed circuit thereon. Like insulating board 10, insulating board 11 includes printed wiring on surface 11*a* of the board and electrical components, such as transistors 53 and 54, resistor 55 and capacitor 56, mounted on the opposite surface of the board.

The electronic circuit construction further includes a printed circuit transformer having the primary winding 12*a* on the insulating board 10 and electrically connected into the printed circuit on the board 10 and the secondary winding 12*b* on the insulating board 11 and electrically connected into the printed circuit on board 11. The primary winding 12*a* and the secondary winding 12*b* are disposed opposite each other and both are in the form of flat spiral conductors. The transformer illustrated is a step down transformer with the primary winding 12*a* having more turns than the secondary winding 12*b*.

Two wires 57 and 58, connected to the circuit on board 10, serve to translate the supply voltage and input signal, respectively, to the circuit, while a third wire 59 serves as a ground connection. Two wires 60 and 61, leading from the circuit on board 11, serve as output leads for the circuit.

The electronic circuit construction additionally includes an electrical shielding member 13 disposed between insulating boards 10 and 11. The electrical shielding member 13 is in the form of a sheet of suitable electrical shielding material carried on an insulating board 14 which provides both support to the sheet 13 and insulation when the boards 10 and 11 are brought together as shown in FIGURE 2. The electrical shielding member 13 is composed of two portions. One portion is a solid planar portion disposed between the printed circuits and provides electrical shielding to minimize capacitive coupling between the printed circuits. Such capacitive coupling is created when electrical components or wires in close proximity to each other carry electrical signals. The second portion of the electrical shielding member 13 is an interspaced portion disposed between the primary and secondary windings 12*a* and 12*b*, respectively. The particular interspaced portion illustrated in a pattern of parallel strips 13*a* of the shielding material having cleared portions 13*b* between the strips which permit inductive coupling between the windings 12*a* and 12*b*.

An additional insulating board 15 is provided to serve as a spacer between the printed wiring on surface 10*a* and the shielding material 13 when the boards are brought together in the manner illustrated in FIGURE 2. In particular, the surfaces 10*a* and 11*a* face each other. Insulating board 15, disposed between boards 10 and 11, is positioned against surface 10*a* and insulates the printed wiring on surface 10*a* from the shielding sheet 13. Board 14 and the shielding sheet 13 are interposed between boards 11 and 15 with the sheet 13 positioned against board 15 and board 14 positioned against the printed wiring on surface 11*a*. The stack comprising boards 10, 11, 14 and 15 and the sheet 13 is held together by a nylon screw 16 and a nylon nut 17 turned onto the screw. The screw 16 is passed through aligned holes in the boards and the shielding sheet 13 .The coupling between the transformer windings 12*a* and 12*b* may, if desired, be adjusted by the screw 16 and nut 17.

Figure 3:
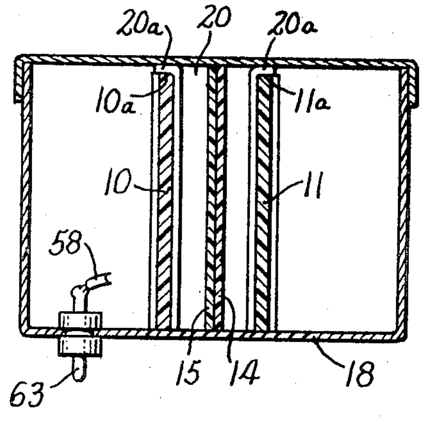
FIGURE 3 is a sectional view taken along line 3—3 of FIGURE 2.

As shown in FIGURE 2, the stack may be inserted into a case 18 of suitable electrical shielding material. This is accomplished by sliding one end of the stack into a channel 19, while at the same time spreading the opposite ends of boards 10 and 11, sliding boards 14 and 15 into a channel 20 and positioning boards 10 and 11 outside the channel 20 and beneath a pair of angles 20*a*. The spread end of the stack is shown in detail in the sectional view of FIGURE 3. As shown in FIGURE 1, the boards 10 and 11 have cutout portions 10*b* and 11*b*, respectively, at one of their corners so that the boards fit securely beneath the angles 20*a*. By spreading the boards 10 and 11 and positioning them outside the channel 20 and beneath angles 20*a*, the entire unit remains securely in place within the case 18 due to the boards 10 and 11 bearing against the outside surfaces of the channel 20.

A plurality of terminals 62 through 66, inclusive, is provided in a wall of the case 18. The wires 57 through 61, inclusive, are connected to the terminals 62 through 66, inclusive. The terminals are insulated from the case 18 and are accessible from outside the case. A suitable power supply may be connected to the outside end of terminal 62 to provide the required supply voltage to the circuit within the case while a source of an input signal may, in a similar manner, be connected to the outside end of terminal 63 to provide an input signal to the circuit within the case. A utilizing circuit may be connected across terminals 65 and 66. The terminal 64 may be connected to a system ground.

A suitable cover is provided for the case 18 to completely shield the circuitry within the case. The space within the case 18 is divided into two compartments by the shielding sheet 13. The printed circuit on board 10 is isolated, with respect to D-C signals, from the printed circuit on board 11. The two printed circuits are coupled together through the inductive coupling between the two transformer windings 12*a* and 12*b* passing through the interspaced portion of shielding sheet 13. Such construction provides an effective D-C isolation betwen the input signal source connected to the printed circuit on board 10 through terminal 63 and the utilizing circuit connected to the printed circuit on board 11 through the terminals 65 and 66.

Figure 5:
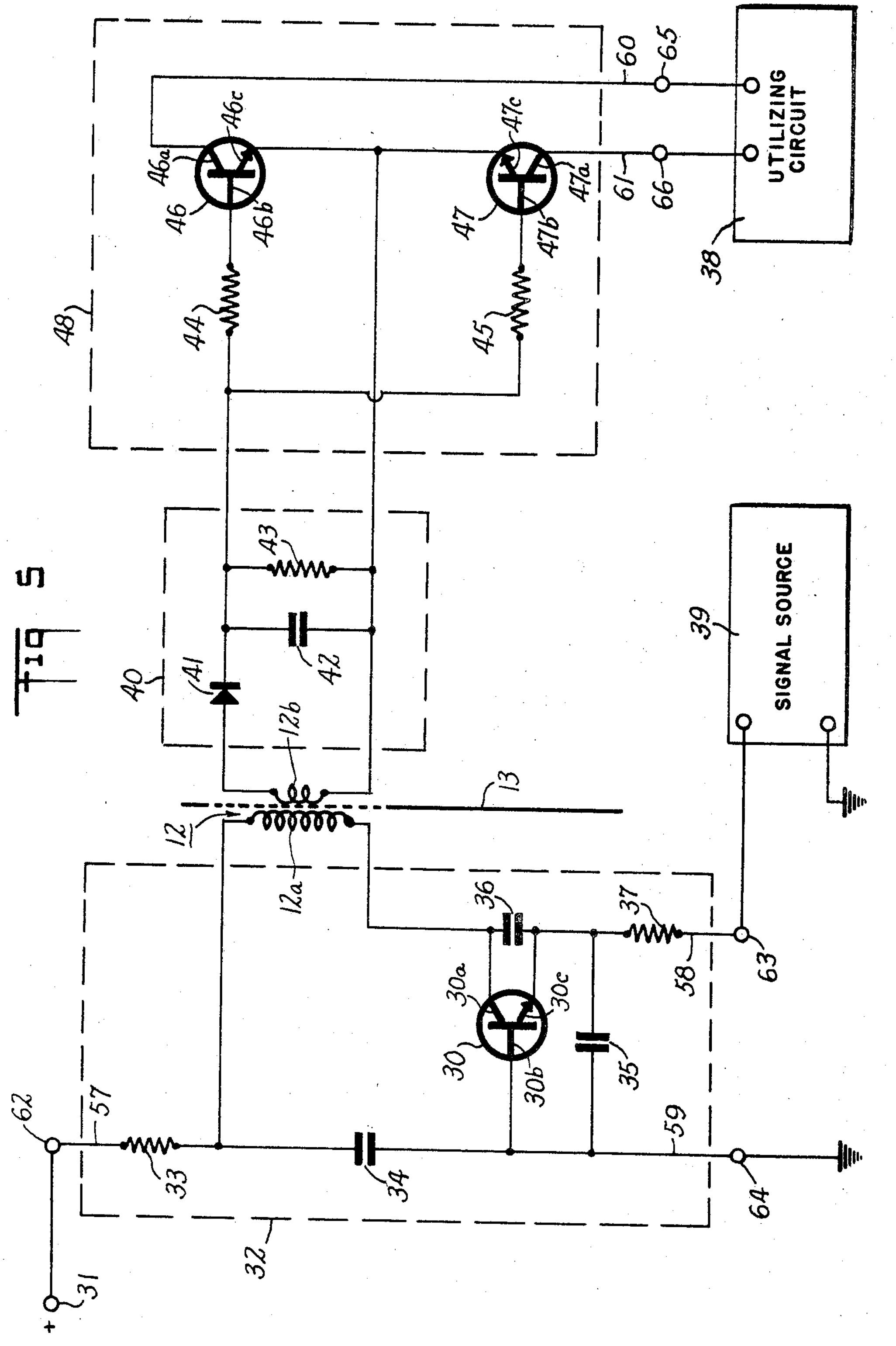
FIGURE 5 is a schematic diagram of an electronic switch constructed in accordance with the present invention.

A typical isolating circuit which may be developed on the insulating boards 10 and 11 is shown in the schematic diagram of FIGURE 5. This circuit is an electronic switch which provides D-C isolation between a signal source 39 and a utilizing circuit 38. Signal source 39 may, for example, be a pulse source which provides a pulse of variable duration proportional to some quantity for controlling electro-mechanical apparatus such as an electrically controlled but pneumatically driven process valve. The utilizing circuit 38 may include an electronic integrator which serves as the control circuit for this valve. It is important to minimize, and preferably eliminate, leakage currents when employing electronic integrators because a small leakage existing over a long period of time can create a substantial error in the output of the integrator.

Referring to FIGURE 5 where elements corresponding to elements in FIGURES 1 through 4, inclusive, have been given the same reference numerals, the electronic switch includes an initially quiescent oscillator including a primary winding 12*a* of a transformer 12. The oscillator is of the Colpitts type and includes in addition to the winding 12*a*, a transistor 30. The collector electrode 30*a* of transistor 30 is connected to one end of the winding 12*a* while the base electrode 30*b* is connected to the other end of the winding 12*a* through a capacitor 34. The base electrode 30*b* is also connected to the emitter electrode 30*c* through a capacitor 35, while the collector electrode 30*a* is connected to the emitter electrode 30*c* through a capacitor 36. The junction of the primary winding 12*a* and capacitor 34 is connected through a resistor 33 and wire 57 to terminal 62 which, in turn, is connected to a source of positive supply voltage designated by the reference numeral 31. The base electrode 30*b* is connected through wire 59 to terminal 64 which is grounded.

Also included in the electronic switch shown in FIGURE 5 are means for translating an input signal to the oscillator. Such means include a terminal 63 to which the signal source 39 is connected, along with wire 58 and a coupling resistor 37 connected to the emitter electrode 30*c*.

Those components in FIGURE 5 included within the dotted line designated by reference numeral 32 may constitute the printed circuit developed on insulating board 10 in FIGURES 1 through 4, inclusive. The terminals 62, 63 and 64 in FIGURE 5 are the terminals set in, and insulated from, the case 18 in FIGURE 2. The transformer winding 12*a* in FIGURE 5 corresponds to the transformer winding developed on the insulating board 10.

Also included in the electronic switch shown in FIGURE 5 is a rectifier circuit 40 including a rectifier 41, a capacitor 42 and resistor 43. The rectifier circuit 40 is connected across the secondary winding 12*b* of the transformer 12.

Connected to the output of rectifier circuit 40 is an output switching circuit 48. The output switching circuit 48 includes a pair of initially nonconductive transistors 46 and 47 having their emitter electrodes 46*c* and 47*c* connected together. The junction of emitter electrodes 46*c* and 47*c* is connected to the junction of winding 12*b*, capacitor 42 and resistor 43. The junction of rectifier 41, capacitor 42 and resistor 43 is connected through a pair of coupling resistors 44 and 45 to the base electrodes 46*b* and 47*b* of transistors 46 and 47, respectively. The collector electrodes 46*a* and 47*a* of transistors 46 and 47, respectively, are connected by means of wires 60 and 61 to terminals 65 and 66 across which the utilizing circuit 38 is connected.

The rectifier circuit 40 and the output circuit 48 may constitute the printed circuit developed on insulating board 11 in FIGURES 1 through 4, inclusive. The terminals 65 and 66 in FIGURE 5 are the terminals set in, and insulated from, the case 18 in FIGURE 2. The transformer winding 12*b* in FIGURE 5 corresponds to the transformer winding developed on the insulating board 11.

The partially dotted line 13 in FIGURE 5 corresponds to the shielding member 13 in FIGURES 1 through 4, inclusive. The dotted portion of line 13 is the interspaced portion of the shield disposed between the transformer windings 12*a* and 12*b*.

In the absence of an input pulse from signal source 39, the terminal 63 is at ground potential and transistor 30 is nonconductive. When a negative input pulse, supplied by the signal source 39, is translated along wire 58 and through resistor 37 to transistor 30, transistor 30 is rendered conductive and the oscillator is energized. The oscillator develops a series of oscillations across the primary winding 12*a* for the duration of the input pulse. At the termination of the input pulse, the terminal 63 returns to ground potential and transistor 30 becomes nonconductive. The oscillator returns to its initial quiescent state. The result is that the series of oscillations developed by the oscillator is modulated by the input pulse.

The oscillations developed across primary winding 12*a* are coupled to the rectifier circuit 40 by means of the secondary winding 12*b*. The modulation of the oscillations is detected by the rectifier circuit 40 and is present across the resistor 43. The detected modulation is coupled to transistors 46 and 47. In a typical application, the two leads from the utilizing circuit 38 corresponds to two points which are to be connected together for a prescribed time equal to the duration of the pulses from signal source 39. When the detected modulation is coupled to the transistors 46 and 47, the two transistors are rendered conductive with the result that the two terminals 65 and 66 are connected together through the transistors 46 and 47. This connection between the terminals 65 and 66 exists for the durations of the input pulses from signal source 39. Thus, the desired control of the utilizing circuit 38 by the pulses from the signal source 39 is effected, although the two circuits are isolated from each other with respect to D-C signals.

The purpose in employing two transistors in the output switching circuit 48 is to compensate for transistor offset. In the arrangement shown, the effects of one transistor in creating an offset voltage are neutralized by similar effects of the other transistor.

While there has been described what is at present considered to be the preferred embodiment of this invention it will be obvious to those skilled in the art that various changes and modifications may be made therein without departing from the invention and it is, therefore, aimed to cover all such changes and modifications as fall within the true spirit and scope of the invention.

What is claimed is:

1. An electronic circuit construction comprising:
a first insulating board having a first printed circuit thereon;
a second insulating board having a second printed circuit thereon;
a printed circuit transformer having the primary winding thereof on said first insulating board and electrically connected into said first printed circuit and the secondary winding thereof on said second insulating board disposed opposite to said primary winding and electrically connected into said second printed circuits;
and an electrical shielding member interposed between said first and second insulating boards and having a solid planar portion disposed between said first and second printed circuits for electrically shielding said printed circuits from each other to prevent capacitive coupling between said printed circuits and an interspaced portion disposed between said primary and secondary windings for permitting inductive coupling between said windings.

2. An electronic circuit construction according to claim 1 wherein the primary winding is a first flat spiral conductor and the secondary winding is a second flat spiral conductor.

3. An electronic circuit construction comprising:
a first insulating board having a first printed circuit thereon;
a second insulating board having a second printed circuit thereon;
a printed circuit transformer having the primary winding thereof in the form of a flat spiral conductor on said first insulating board and electrically connected into said first printed circuit and the secondary winding thereof in the form of a flat spiral conductor on said second insulating board disposed opposite to said primary winding and electrically connected into said second printed circuit;
and an electrical shielding sheet interposed between said first and second insulating boards and having a solid planar portion disposed between said first and second printed circuits for electrically shielding said printed circuits from each other to prevent capacitive couplings between said printed circuits and an interspaced portion disposed betwen said primary and secondary windings for permitting inductive coupling between said windings.

4. An electronic circuit construction according to claim 3 wherein the interspaced portion of the shielding sheet is a pattern of parallel strips of shielding material.

5. An electronic circuit construction comprising:
a first insulating board having a first printed circuit including printed wiring and electrical components;
a second insulating board having a second printed circuit including printed wiring and electrical components;
a printed circuit transformer having a first flat spiral conductor serving as a primary winding on said first board and electrically connected into said printed wiring on said first board and a second flat spiral conductor serving as a secondary winding on said second board and electrically connected into said printed wiring on said second board;
and a sheet of electrical shielding material interposed between said first and second insulating boards and having a solid planar portion disposed between said first and second printed circuits for electrically shielding said printed circuits from each other to prevent capacitive couplings betwen said printed circuits and an interspaced portion disposed between said first and second flat spiral conductors for permitting inductive coupling between said flat spiral conductors.

6. An electronic circuit construction comprising:
a first insulating board having a first printed circuit including printed wiring on a first surface of said first board and electrical components mounted on a second surface of said first board;
a second insulating board having a second printed circuit including printed wiring on a first surface of said second board and electrical components mounted on a second surface of said second board;
a printed circuit transformer having a first flat spiral conductor serving as a primary winding on said first surface of said first board and electrically connected into said printed wiring on said first board and a second flat spiral conductor serving as a secondary winding on said first surface of said second board and electrically connected into said printed wiring on said second board;
and a sheet of electrical shielding material interposed between said first and second insulating boards and having a solid planar portion disposed between said first and second printed circuits for electrically shielding said printed circuits from each other to prevent capacitive coupling between said printed circuits and an interspaced portion disposed betwen said first and second flat spiral conductors for permitting inductive coupling between said flat spiral conductors.

7. An electronic circuit construction according to claim 6 wherein the interspaced portion of the shielding sheet is a pattern of parallel strips of shielding material.

8. An electronic circuit construction comprising:

a first insulating board having a first printed circuit including printed wiring on a first surface of said first board and electrical components mounted on a second surface of said first board;

a second insulating board having a second printed circuit including printed wiring on a first surface of said second board facing said first surface of said first board and electrical components mounted on a second surface of said second board;

a printed circuit transformer having a first flat spiral conductor serving as a primary winding on said first surface of said first board and electrically connected into said printed wiring on said first board and a second flat spiral conductor serving as a secondary winding on said first surface of said second board and electrically connected into said printed wiring on said second board;

and a sheet of electrical shielding material interposed betwen said first and second insulating boards and having a solid planar portion disposed between said first and second printed circuits for electrically shielding said printed circuits from each other to prevent capacitive coupling between said printed circuits and an interspaced portion of parallel strips of said shielding material disposed between said first and second flat spiral conductors for permitting inductive coupling between said flat spiral conductors.

9. An electronic circuit construction comprising:

a first insulating board having a first printed circuit including printed wiring on a first surface of said first board and electrical components mounted on a second surface of said first board;

a second insulating board having a second printed circuit including printed wiring on a first surface of said second board and electrical components mounted on a second surface of said second board;

a printed circuit transformer having a first flat spiral conductor serving as a primary winding on said first surface of said first board and electrically connected into said printed wiring on said first board and a second flat spiral conductor serving as a secondary winding on said first surface of said second board and electrically connected into said printed wiring on said second board;

and a third insulating board having a sheet of electrical shielding material interposed between said first and second insulating boards, said sheet of electrical shielding material having a solid planar portion disposed between said first and second printed circuits for electrically shielding said printed circuits from each other to prevent capacitive coupling between said printed circuits and an interspaced portion of parallel strips of said shielding material disposed between said first and second flat spiral conductors for permitting inductive coupling between said flat spiral conductors.

10. An electronic circuit construction comprising:

a first insulating board having a first printed circuit including printed wiring on a first surface of said first board and electrical components mounted on a second surface of said first board;

a second insulating board having a second printed circuit including printed wiring on a first surface of said second board facing said first surface of said first board and electrical components mounted on a second surface of said second board;

a third insulating board disposed between said first and second boards and positioned against said first surface of said first board;

a printed circuit transformer having a first flat spiral conductor serving as a primary winding on said first suface of said first board and electrically connected into said printed wiring on said first board and a second flat spiral conductor serving as a secondary winding on said first surface of said second board and electrically connected into said printed wiring on said second board;

a fourth insulating board having a sheet of electrical shielding materail interposed between said second and third insulating boards, said sheet of electrical shielding material positioned against said third board and having a solid planar portion disposed between said first and second printed circuits for electrically shielding said printed circuits from each other to prevent capacitive coupling between said printed circuits and an interspaced portion disposed between said first and second flat spiral conductors for permitting inductive coupling between said flat spiral conductors;

and means for securing said four insulating boards together in a stack.

11. An electronic circuit construction comprising:

a first insulating board having a first printed circuit including printed wiring on a first surface of said first board and electrical components mounted on a second surface of said first board;

a second insulating board having a second printed circuit including printed wiring on a first surface of said second board facing said first surface of said first board and electrical components mounted on a second surface of said second board;

a third insulating board disposed between said first and second boards and positioned against said first surface of said first board;

a printed circuit transformer having a first flat spiral conductor serving as a primary winding on said first suface of said first board and electrically connected into said printed wiring on said first board and a second flat spiral conductor serving as a secondary winding on said first surface of said second board and electrically connected into said printed wiring on said second board;

a fourth insulating board having a sheet of electrical shielding material interposed between said second and third insulating boards, said sheet of electrical shielding material positioned against said third board and having a solid planar portion disposed between said first and second printed circuits for electrically shielding said printed circuits from each other to prevent capacitive coupling between said printed circuits and an interspaced portion of parallel strips of said shielding material disposed between said first and second flat spiral conductors for permitting inductive coupling between said flat spiral conductors;

and means for securing said four insulating boards together in a stack.

References Cited

UNITED STATES PATENTS

| | | | |
|---|---|---|---|
| Re. 25,317 | 1/1963 | McCoy. | |
| 2,586,854 | 2/1952 | Myers. | |
| 2,786,984 | 3/1957 | Slate ____________ | 336—200 X |
| 3,157,857 | 11/1964 | Stapper et al. | |

ROBERT K. SCHAEFER, *Primary Examiner.*

D. SMITH, *Assistant Examiner.*